(12) United States Patent
Borrat-Michaud et al.

(10) Patent No.: US 8,891,242 B2
(45) Date of Patent: Nov. 18, 2014

(54) HEAT SINKING DEVICE, NOTABLY FOR VERTICAL COMPONENTS AND/OR COMPONENTS OF COMPLEX FORM

(75) Inventors: Pierre Borrat-Michaud, Angers (FR); Anne-Gaëlle Tallec, Angers (FR)

(73) Assignee: Thales, Neuilly sur Seine (FR)

( * ) Notice: Subject to any disclaimer, the term of this patent is extended or adjusted under 35 U.S.C. 154(b) by 282 days.

(21) Appl. No.: 13/510,941

(22) PCT Filed: Nov. 19, 2010

(86) PCT No.: PCT/EP2010/067865
§ 371 (c)(1),
(2), (4) Date: Jul. 5, 2012

(87) PCT Pub. No.: WO2011/061312
PCT Pub. Date: May 26, 2011

(65) Prior Publication Data
US 2012/0287580 A1    Nov. 15, 2012

(30) Foreign Application Priority Data

Nov. 20, 2009 (FR) .................................... 09 05590

(51) Int. Cl.
*H05K 7/20* (2006.01)

(52) U.S. Cl.
CPC ........ *H05K 7/20445* (2013.01); *H05K 7/20418* (2013.01); *H05K 7/20154* (2013.01)
USPC ...... 361/710; 361/679.54; 361/708; 361/709; 361/704; 165/80.2; 165/104.33; 29/832; 29/840

(58) Field of Classification Search
USPC ............... 361/679.46, 679.54, 704–712, 715, 361/719–722; 165/80.2, 80.3, 104.33, 185; 174/15.1, 16.3, 251–254; 257/687, 257/681, 680, 676, 704–726; 29/832, 840, 29/841, 843, 592.1
See application file for complete search history.

(56) References Cited

U.S. PATENT DOCUMENTS

| | | | | |
|---|---|---|---|---|
| 3,885,304 | A * | 5/1975 | Kaiser et al. ..................... | 29/832 |
| 5,357,673 | A * | 10/1994 | Polak et al. ...................... | 438/51 |
| 5,539,253 | A * | 7/1996 | Nagaune ........................ | 257/687 |
| 6,882,041 | B1 * | 4/2005 | Cheah et al. .................. | 257/704 |
| 7,657,998 | B2 * | 2/2010 | Tanaka ............................ | 29/840 |
| 2004/0070946 | A1 | 4/2004 | Matsuo et al. | |
| 2007/0166866 | A1 * | 7/2007 | Appelt et al. ................... | 438/64 |
| 2007/0205425 | A1 * | 9/2007 | Harada ........................... | 257/98 |

FOREIGN PATENT DOCUMENTS

| | | | |
|---|---|---|---|
| GB | 1202220 A | 8/1970 | |
| JP | 401096952 A * | 4/1989 | ............. H01L 23/34 |

* cited by examiner

*Primary Examiner* — Michail V Datskovskiy
(74) *Attorney, Agent, or Firm* — Baker and Hostetler LLP

(57) ABSTRACT

A heat sinking device for a component mounted on an electronic circuit board, including: a hollow body, of straight cylindrical or prismatic form, including a first material, arranged vertically on top of the electronic circuit board, the useful volume of the body including at least the component, a resin including a second material, at least partially filling the internal volume of the body so as to contain the component. The heat sinking device can be arranged on an insulating separator element, the resin can be introduced in the liquid state.

14 Claims, 1 Drawing Sheet

HEAT SINKING DEVICE, NOTABLY FOR VERTICAL COMPONENTS AND/OR COMPONENTS OF COMPLEX FORM

CROSS-REFERENCE TO RELATED APPLICATIONS

This application is a National Stage of International patent application PCT/EP2010/067865, filed on Nov. 19, 2010, which claims priority to foreign French patent application No. FR 09 05590, filed on Nov. 20, 2009, the disclosures of each of which are incorporated by reference in their entireties.

FIELD OF THE DISCLOSED SUBJECT MATTER

The present invention relates to a heat sinking device, notably for vertical components and/or components of complex form. It applies notably to the field of electronics, and more particularly to the field of printed electronic boards on which discrete components are mounted.

BACKGROUND

Numerous systems include electronic devices, typically in the form of electronic circuit boards, within which components may be integrated and/or on the surface of which discrete components may be positioned. Such boards are, for example, known by the acronym PCB, which stands for "printed circuit board". The electronic circuit boards can be designed for specific applications and thus be dedicated to these applications, but may also take the form of boards of available on the market and which can be used for various applications.

Typically, the components with which electronic circuit boards are equipped produce, when they are in use, a certain quantity of heat which may be detrimental to the correct operation of the system. It is consequently necessary to design an electronic system in such a way as to control the heat production phenomena induced in the components that it incorporates, in order for the operating temperatures never to reach critical values which could result in failures or malfunctioning. It is also necessary to control the heat production and dissipation phenomena, in order for the operation of the system to be guaranteed within temperature ranges whose extent varies according to the applications.

Notably, power semiconductors exhibit, in operation, significant losses producing an intense heat. For such components it is possible, according to techniques which are in themselves known from the prior art, to make use of heat sinking devices. It is, for example, possible to use heat sinks placed in immediate proximity to the components producing heat, often called "hot components". A heat sink may, for example, take the form of a part produced in a material offering heat absorption qualities, and for example provided with fins. It is also possible to make use of a thermal paste positioned between the component and the heat sinking device, in order to ensure an optimum contact offering a high degree of thermal conductivity. This technique has the drawback of being ill-suited to components positioned vertically on an electronic board, or even components of complex form.

Another known technique consists in making use of a fan positioned in proximity to the component. This technique has the drawback of involving moving parts, requiring a power supply, producing sound nuisances, and offering low reliability.

It is also possible to make use of Peltier-effect cooling devices which offer the advantage of not requiring moving parts and of offering effective cooling; however, such devices have drawbacks associated with condensation, and are more specifically appropriate for the cooling of components such as microprocessors.

SUMMARY

One aim of the present invention is to overcome at least the abovementioned drawbacks, by proposing a heat sinking device forming a heat sink system based on conduction of the heat via a resin offering good thermal properties, and coating the component for which the heat has to be dissipated.

One advantage of the invention is that the heat sinking device according to one of the embodiments of the invention can be adapted to a wide diversity of components, including components mounted vertically on an electronic circuit board, or even components of complex form.

Another advantage of the invention is that a system incorporating heat sinking devices according to the invention exhibits a very good immunity, notably with regard to mechanical impacts or vibrations.

Yet another advantage of the invention is that a component associated with a heat sinking device according to one of the embodiments described, can easily be removed, for example as part of manufacturing or maintenance operations on the system in which the component is incorporated.

Yet another advantage of the invention is that a heat sinking device according to one of the embodiments described can be adapted to components already present on electronic boards.

For this purpose, the subject of the invention is a heat sinking device, notably for components mounted on an electronic circuit board, comprising:
  a hollow body, of straight cylindrical or prismatic form, consisting of a first material, arranged vertically on top of the electronic circuit board, the useful volume of the cylindrical body including at least the component,
  a resin consisting of a second material, at least partially filling the internal volume of the body so as to contain at least a portion of the component.

In one embodiment of the invention, the heat sinking device may be characterized in that an insulating separator element consisting of a third material is arranged between the heat sinking device and the electronic circuit board.

In one embodiment of the invention, the heat sinking device may be characterized in that the body comprises at least one tab in its top portion, offering at least one planar surface substantially parallel to the base of the body.

In one embodiment of the invention, the heat sinking device may be characterized in that the resin is poured into the body in the liquid state at a first temperature and hardens by polymerization at a second temperature.

In one embodiment of the invention, the heat sinking device may be characterized in that the first material is a copper-beryllium alloy $CuBe_2$.

In one embodiment of the invention, the heat sinking device may be characterized in that the body is of rectangular section, and that it comprises two of said tabs formed by protuberances on two opposite faces of the body, the two tabs comprising a particular fold line conferring on them a coefficient of flexibility along the main axis of the body, said planar surfaces being able to be in contact with a main heat sink.

Also the subject of the present invention is a system comprising an electronic circuit board having a plurality of components arranged on the surface of the electronic circuit board, characterized in that at least one of the components arranged on the surface is associated with a heat sinking device according to one of the embodiments described.

Also the subject of the present invention is a system comprising an electronic circuit board having a plurality of components arranged on the surface of the electronic circuit board, characterized in that at least one of the components arranged on the surface is associated with a heat sinking device according to one of the embodiments described, the planar surfaces being in contact with the bottom surface of a main heat sink.

BRIEF DESCRIPTION OF THE DRAWINGS

Other features and advantages of the invention will become apparent from reading the description, given as an example, and in light of the appended drawings which represent.

DETAILED DESCRIPTION

Figure 1:
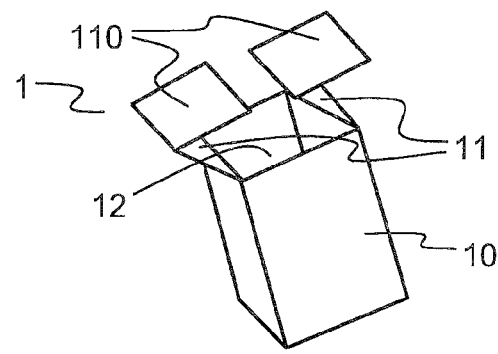
FIG. 1, a perspective view of a heat sinking device, according to one embodiment of the invention.

FIG. 1 presents a perspective view illustrating a heat sinking device, according to an exemplary embodiment of the present invention.

The heat sinking device 1 may comprise a body 10 of which at least a portion of the internal volume is filled with a resin 12. Advantageously, as is illustrated in FIG. 1, the heat sinking device 1 may comprise at least one tab in its top portion. In the example illustrated by FIG. 1, two tabs 11 are formed above the top surface of the body 10 and each offers a surface 110 which is substantially planar and parallel to the base of the body 10.

The body 10 may be of cylindrical form, or even of straight prismatic form. In the example illustrated by FIG. 1, the body 10 is a straight prism of rectangular section.

The body 10 may be arranged in such a way as to include the component, not represented in the figure, for which the heat produced has to be dissipated and with which the heat sinking device 1 has to be associated. The component is also buried in a volume of resin 12 contained inside the body 10. The resin 12 does not necessarily include all of the component, but it must at the very least include the hot portions of the component.

The body 10 is made of a first material, for example metallic, offering a good heat conduction. The first material must also offer a sufficient rigidity, in order to ensure that the resin 12 and the component that it contains are securely held. The first material must also offer good properties in terms of elasticity. This is because the tabs 11 may be intended to be in contact with an element such as a cover or a main heat sink, as is explained in detail below, with reference to FIG. 3.

The tabs 11 may notably be formed in one and the same block with the body 10. For example, by a fold produced on protuberances of the body 10. In the example illustrated by the figure, the body 10 may be of straight prismatic form, with rectangular section. Protuberances may be produced on two opposite vertical faces of the body 10. Two fold lines can then make it possible to form the abovementioned planar surfaces 110, while conferring properties of elasticity on the tabs 11, notably along the main axis of the body 10. The first material may, for example, be a copper-beryllium alloy $CuBe_2$, offering a good trade-off for the characteristics cited previously.

Advantageously, it is possible, for practical reasons, to form the planar surfaces 110 in such a way that the plane containing them forms, with the plane of the base of the body 10, a non-zero angle, the free ends of the planar surfaces 110 being the furthest away from the base of the body 10. In this way, it is certain that, once the cover or the main heat sink is positioned on the top of the planar surfaces 110, the contact is distributed over all of the area of the planar surfaces 110.

The resin 12 is made of a second material, for example of polymer type. The second material should confer very good characteristics in terms of thermal conductivity on the resin 12. Also, the second material should be electrically insulating. For example, the second material may be chosen to offer a thermal conductivity typically greater than $1\ W.m^{-1}.K^{-1}$. Advantageously, it is possible, in one embodiment of the invention, to proceed with the filling of the body 10 with the resin 12 when the resin 12 is in liquid phase, then to proceed with the polymerization of the resin 12: the body 10 in this way acts as a shuttering intended to contain the resin 12 which is poured therein. Thus, the second material may be fluid at the time of the pouring of the resin 12, then solid after polymerization. It is, for example, possible to use a two-component resin, consisting of a first compound A and of a second compound B, the compound B being a catalyst, added to initiate the polymerization of the resin 12. The compound A of the resin 12 may, for example, be preheated to a predetermined temperature, the value of which is compatible with the range of use of the component, typically to 40° C., before mixing with the compound B. Furthermore, the second material chosen for the resin 12 should confer on it a resistance to the planned usage temperatures, that is to say, temperatures extending typically at least within a range between −40° C. and +85° C. The second material may, for example, be a two-component resin of epoxy type.

Advantageously, the resin 12 in the liquid state should offer a coefficient of viscosity such that it is not too fluid, in order to limit the risks of flow of the resin out of the body 10. Also, the resin 12 in the solid state, that is to say after polymerization, should be hard enough to ensure that the heat sinking device 1 and the component that it contains are securely held.

One advantage obtained by the present invention is that a heat sinking device 1 may be added to one or more components mounted on an existing electronic board, for example a retail electronic board, but initially intended to be fan-cooled.

Figure 2:
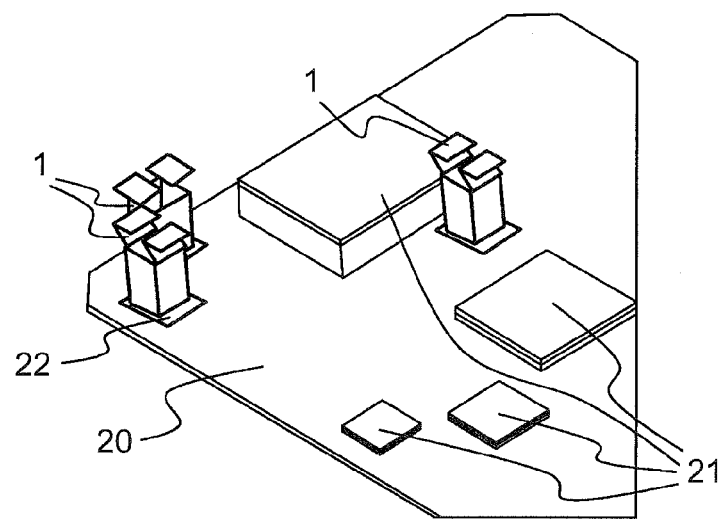
FIG. 2, a perspective view of a plurality of heat sinking devices arranged on an electronic circuit board, according to one embodiment of the invention.

FIG. 2 shows a perspective view illustrating a plurality of heat sinking devices arranged on an electronic circuit board, according to one embodiment of the invention.

An electronic circuit board 20, for example of PCB type, notably comprises a plurality of components 21 arranged on the surface thereof. The electronic circuit board 20 also comprises a plurality—four in the example of the figure—of components associated with heat sinking devices 1, with reference to FIG. 1 described above. Each heat sinking device 1 is arranged on top of the electronic circuit board 20, substantially vertically and in such a way as to contain the component with which it is associated. Advantageously, an insulating separator element 22 may be arranged between the surface of the electronic circuit board 20 and the heat sinking device 1. The insulating separator element 22 provides an electrical insulation between the electronic circuit board 20 and the body of the heat sinking device. The third material should thus exhibit flexibility characteristics in order for the distribution of the insulating separator element 22 under the body of the heat sinking device to confer a seal-tightness with regard to the flow of the resin. The third material should also exhibit electrical insulation properties. The third material may thus, for example, be a silicone rubber, or a mixture of silicone rubber and of glass fibers, for example in the form of sheets with a typical thickness of the order of 100 μm.

The insulating separator element 22 also makes it possible to prevent the resin intended to be contained in the body of heat sinking device 1 from flowing out when the latter is filled; it also makes it possible to consider the possibility of unsoldering the component, for example in the event of failure thereof. In practice, the resin is particularly attached by bonding to the electronic circuit board 20 when the latter is polymerized. The insulating separator element 22 then makes it possible to minimize the surface area of resin in contact with the electronic circuit board 20, thus facilitating the ungluing of the component-heat sinking device assembly, if that should prove necessary when manufacturing or else maintaining the system including these elements.

Figure 3:
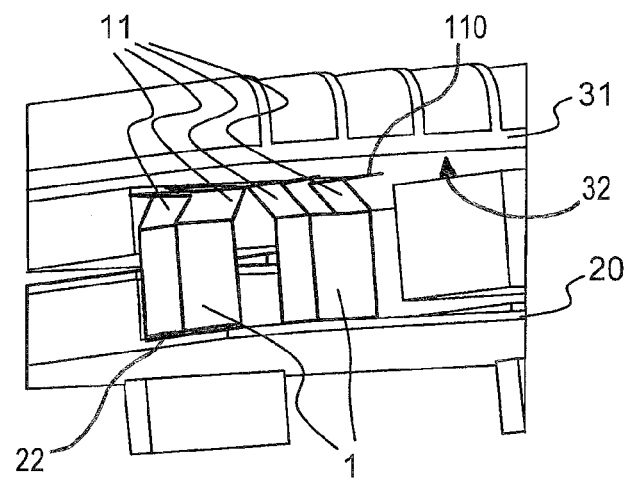
FIG. 3, a perspective view of a plurality of heat sinking devices arranged between an electronic circuit board and a main dissipater, according to one embodiment of the invention.

FIG. 3 shows a perspective view of a plurality of heat sinking devices arranged between an electronic circuit board and a main dissipater, according to one embodiment of the invention.

In the example of FIG. 3, two heat sinking devices 1 are arranged around components mounted on the electronic circuit board 20, and for which heat has to be dissipated. The example illustrated by FIG. 3 presents a configuration similar to the configuration described above with reference to FIG. 2.

It is possible to arrange a main heat sink 31 making it possible to dissipate the heat produced by a plurality of components mounted on the electronic circuit board 20, even by all of them. The main heat sink 31 may, for example, take the form of a metal heat sink provided with fins. The tabs 11 arranged on the heat sinking devices 1, and notably the planar surfaces 110 formed on the tabs 11, may advantageously be in contact with a bottom surface 32 of the main heat sink 31. The tabs 11, behaving as spring blades, make it possible notably to ensure a permanent contact between the planar surfaces 110 and the main heat sink 31. It should be noted that the coefficient of flexibility of the tabs 11 may be adjusted according to the requirements, via a modification of one or more parameters out of the nature of the first material forming the body, the thickness of the tabs, the length of the tabs, the type of fold line forming the tabs and the planar surfaces. In such a configuration, the heat follows an optimal pathway, starting from the component, then being dissipated in the resin, and then in the body of the heat sinking device 1, the tabs 11 and finally the main heat sink 31. It is obviously necessary for the various heat sinking devices 1 to be dimensioned such that all of the planar surfaces 110 are substantially contained in one and the same plane, substantially parallel to the plane containing the surface of the electronic circuit board 20.

In an alternative embodiment, it is possible to fasten the main heat sink 31 to the tabs 11, by fastening techniques which are themselves known from the prior art, such as soldering or even bonding techniques. The duly constructed system then offers the advantage that the thermal impacts and vibrations can be dampened by virtue of the properties of elasticity conferred by the tabs 11.

It should be noted that the heat exchange surface area between the components and the resin is identical to that which would exist between the components and the air in the absence of resin. However, the coefficient of thermal conductivity of the resin is much higher than that of the air; consequently, the heat can be effectively conducted toward the body of the heat sinking device 1, which is in turn linked to the main heat sink 31.

The invention claimed is:

1. A heat sinking device for a component mounted on an electronic circuit board, comprising:
   a hollow body having a top portion and a base, the body being of straight cylindrical or prismatic form, comprising a first material, and arranged vertically on top of the electronic circuit board, a useful volume of the body configured to include at least the component; and
   a resin comprising a second material, at least partially filling an internal volume of the body when the body is arranged vertically on top of the electronic circuit board so as to be able to contain at least a portion of the component,
   wherein the body comprises at least one tab in the top portion, offering at least one planar surface substantially parallel to the base of the body.

2. The heat sinking device according to claim 1, wherein an insulating separator element comprising a third material is arranged between the heat sinking device and the electronic circuit board.

3. The heat sinking device according claim 1, wherein the resin is poured into the body in a liquid state at a first temperature and hardens by polymerization at a second temperature.

4. The heat sinking device according to claim 1, wherein the first material is a copper-beryllium alloy $CuBe_2$.

5. The heat sinking device according to claim 1, wherein the body is of rectangular section, and comprises two of said tabs formed by protuberances on two opposite faces of the body, the two tabs comprising a particular fold line conferring on them a coefficient of flexibility along a main axis of the body, said planar surfaces configured to be in contact with a main heat sink.

6. A system comprising an electronic circuit board having a plurality of components arranged on the surface of the electronic circuit board, wherein at least one of the components arranged on the surface is associated with a heat sinking device comprising:
   a hollow body having a top portion and a base, the body being of straight cylindrical or prismatic form, comprising a first material, and arranged vertically on top of the electronic circuit board, a useful volume of the body configured to include at least the component; and
   a resin comprising a second material, at least partially filling an internal volume of the body so as to be able to contain at least a portion of the component, wherein the body comprises at least one tab in the top portion, offering at least one planar surface substantially parallel to the base of the body.

7. The system according to claim 6, wherein an insulating separator element comprising a third material is arranged between the heat sinking device and the electronic circuit board.

8. The system according to claim 6, wherein the resin is poured into the body in a liquid state at a first temperature and hardens by polymerization at a second temperature.

9. The system according to claim 6, wherein the first material is a copper-beryllium alloy $CuBe_2$.

10. The system according to claim 6, wherein the body is of rectangular section, and comprises two of said tabs formed by protuberances on two opposite faces of the body, the two tabs comprising a particular fold line conferring on them a coefficient of flexibility along a main axis of the body, said planar surfaces configured to be in contact with a main heat sink.

11. A system comprising an electronic circuit board having a plurality of components arranged on the surface of the electronic circuit board, wherein at least one of the components arranged on the surface is associated with a heat sinking device comprising:

a hollow body having a top portion and a base, the body being of straight cylindrical or prismatic form, comprising a first material, and arranged vertically on top of the electronic circuit board, a useful volume of the body configured to include at least the component; and a resin comprising a second material, at least partially filling the internal volume of the body so as to be able to contain at least a portion of the component, wherein an insulating separator element comprising a third material is arranged between the heat sinking device and the electronic circuit board, and the body comprises at least one tab in the top portion, offering at least one planar surface substantially parallel to the base of the body, the planar surface being in contact with a bottom surface of a main heat sink.

12. The system according to claim 11, wherein the resin is poured into the body in a liquid state at a first temperature and hardens by polymerization at a second temperature.

13. The system according to claim 11, wherein the first material is a copper-beryllium alloy $CuBe_2$.

14. The system according to claim 11, wherein the body is of rectangular section, and comprises two of said tabs formed by protuberances on two opposite faces of the body, the two tabs comprising a particular fold line conferring on them a coefficient of flexibility along a main axis of the body, said planar surfaces configured to be in contact with the main heat sink.

* * * * *